(12) United States Patent
Magoon et al.

(10) Patent No.: US 7,538,610 B2
(45) Date of Patent: May 26, 2009

(54) METHOD AND SYSTEM FOR ENHANCEMENT OF POWER AMPLIFIER EFFICIENCY THROUGH CONTROLLED VARIATION OF GAIN IN A POWER AMPLIFIER DRIVER

(75) Inventors: Vikram Magoon, San Diego, CA (US); Ali Afashi, San Diego, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 17 days.

(21) Appl. No.: 11/618,864

(22) Filed: Dec. 31, 2006

(65) Prior Publication Data

US 2008/0136515 A1 Jun. 12, 2008

Related U.S. Application Data

(60) Provisional application No. 60/868,818, filed on Dec. 6, 2006.

(51) Int. Cl.
*H03G 3/20* (2006.01)

(52) U.S. Cl. .................................................... 330/136
(58) Field of Classification Search ................. 330/136, 330/133
See application file for complete search history.

(56) References Cited

U.S. PATENT DOCUMENTS 7,005,922 B2 * 2/2006 Oshima et al. .............. 330/278

* cited by examiner

*Primary Examiner*—Robert Pascal
*Assistant Examiner*—Khiem D Nguyen
(74) *Attorney, Agent, or Firm*—McAndrews, Held & Malloy

(57) ABSTRACT

Aspects of a method and system for enhancement of power amplifier (PA) efficiency through controlled variation of gain in a power amplifier driver are presented. Aspects of the system may comprise an envelope detector that enables detection of an amplitude of an analog input signal. The envelope detector may enable computation of a first gain value based on the detection. A second gain value may be computed based on the first gain value. A PA may enable generation of an analog output signal based on the analog input signal, the first gain value and the second gain value.

22 Claims, 4 Drawing Sheets

METHOD AND SYSTEM FOR ENHANCEMENT OF POWER AMPLIFIER EFFICIENCY THROUGH CONTROLLED VARIATION OF GAIN IN A POWER AMPLIFIER DRIVER

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

This application also makes reference to:
U.S. application Ser. No. 11/618,876 filed Dec. 29, 2006; and
U.S. application Ser. No. 11/618,817 filed Dec. 29, 2006.

Each of the above stated applications is hereby incorporated herein by reference in its entirety.

FIELD OF THE INVENTION

Certain embodiments of the invention relate to wireless communications. More specifically, certain embodiments of the invention relate to a method and system for enhancement of power amplifier efficiency through controlled variation of gain in a power amplifier driver.

BACKGROUND OF THE INVENTION

A power amplifier (PA) circuit may be characterized by its mode, or "class" of operation. Exemplary classes include Class A, Class AB, and Class B. In Class A operation, a PA may operate in a conducting, or ON, state during 100% of the cycle, or the entire cycle, of the input signal. In Class A operation, the output signal from the PA is typically a scaled version of the input signal, where the scaling factor is a function of the gain associated with the PA circuit. However, for Class A operation, the PA is typically in a conducting state even when there is no input signal. Furthermore, even when the PA is amplifying an input signal, the efficiency of the PA may not exceed 50%.

In Class B operation, a PA may operate in a conducting state during 50%, or half, of the cycle of the input signal. This may result in large amounts of distortion of the input signal in the output signal. The higher efficiency of the Class B PA results from the PA being in a non-conducting, or OFF, state half of the time.

In Class AB operation, a PA may operate in a conducting state for greater than 50%, but less than 100%, of the cycle of the input signal. In Class AB operation, the PA may be more efficient than in Class A operation, but less efficient than in Class B operation. Furthermore, in Class AB operation, the PA may produce more distortion than in Class A operation, but less than in Class B operation.

The amount of DC power required from a DC power supply may increase with increasing input signal amplitudes to the PA circuit. Large peak input signal amplitude to average input signal amplitude may result in the PA circuit operating with low efficiency.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for enhancement of power amplifier efficiency through controlled variation of gain in a power amplifier driver, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for enhancement of power amplifier efficiency through controlled variation of gain in a power amplifier driver. Various embodiments of the invention may enable the amplitude of input signals to a PA circuit to be controlled within an amplitude range, which enables the PA to operate in an efficient manner. Efficiency, $\eta$, for a PA circuit may be defined as in the following equation:

$$\eta = \frac{P_{RF}}{P_{DC}} \quad [1]$$

where $P_{RF}$ refers to the power level for an RF signal output by a PA circuit in an RF transmitter, and $P_{DC}$ refers to delivered power from a DC power supply source (such as a battery).

When the peak input signal level is large compared to the average input signal level, or high peak to average ratio, the PA circuit may be biased to accommodate the peak input signal level, $P_{INMAX}$. The value of $P_{DC}$ may be set to enable generation of an RF signal output level from the PA circuit, $P_{RFMAX}$, when the corresponding input signal level is $P_{INMAX}$. Thus, efficiency, $\eta$, may be highest for a given value $P_{DC}$ when the RF signal output level from the PA circuit is $P_{RFMAX}$. However, for high peak to average ratios, the input signal level is typically less than $P_{INMAX}$ for a substantial portion of the time that the PA circuit is operating. Therefore, the average RF signal output level, $P_{RFAVG}$, may be significantly lower than $P_{RFMAX}$. Consequently, the need to support high peak to average ratios may result in low efficiency for the PA circuit.

In various embodiments of the invention, an envelope detector circuit may detect the amplitude of an input signal to a power amplifier driver (PAD) circuit, and dynamically adjust the gain of the PA and PAD circuits to maintain a constant input signal level at the PA. The input signal level may be selected to enable efficient operation of the PA. For each adjustment of the PA gain, a corresponding adjustment to PAD gain may be made such that the total gain through the PA and PAD remains constant.

Figure 1:
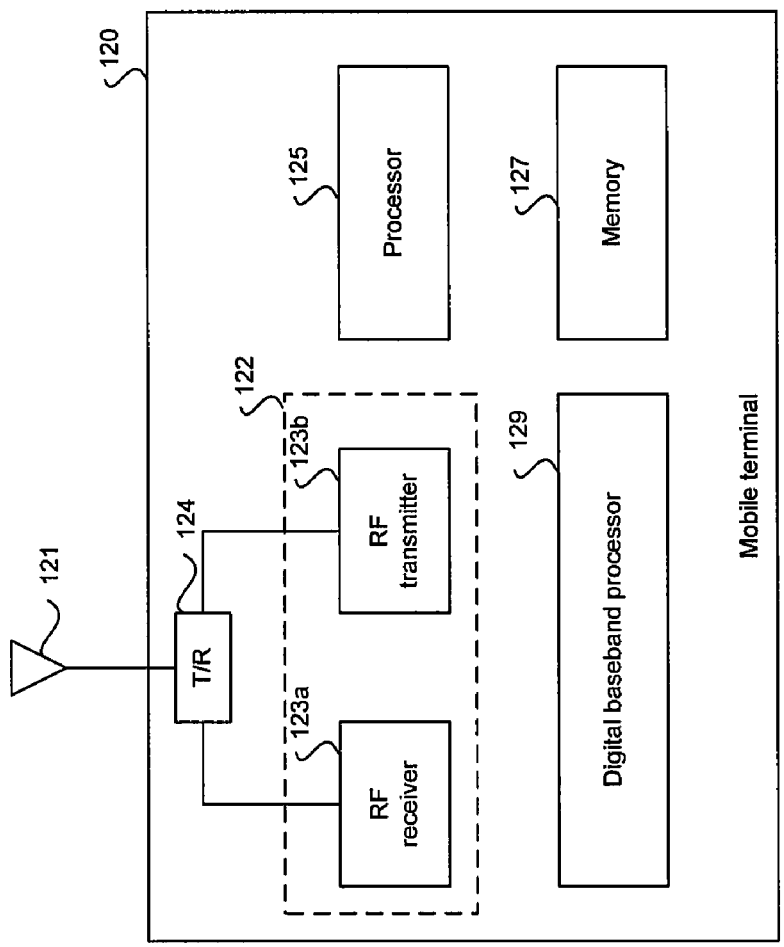
FIG. 1 is a block diagram illustrating and exemplary mobile terminal, which may be utilized in connection with an embodiment of the invention.

FIG. 1 is a block diagram illustrating and exemplary mobile terminal, which may be utilized in connection with an embodiment of the invention. Referring to FIG. 1, there is shown mobile terminal 120 that may comprise an RF receiver 123a, an RF transmitter 123b, a digital baseband processor 129, a processor 125, and a memory 127. In some embodiments of the invention, the RF receiver 123a, and RF transmitter 123b may be integrated into an RF transceiver 122, for example. A single transmit and receive antenna 121 may be communicatively coupled to the RF receiver 123a and the RF transmitter 123b. A switch 124, or other device having switching capabilities may be coupled between the RF receiver 123a and RF transmitter 123b, and may be utilized to switch the antenna 121 between transmit and receive functions.

The RF receiver 123a may comprise suitable logic, circuitry, and/or code that may enable processing of received RF signals. The RF receiver 123a may enable receiving RF signals in frequency bands utilized by various wireless communication systems, such as GSM and/or CDMA, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission via the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the RF receiver 123a to enable receiving RF signals in the appropriate frequency band.

Figure 2:
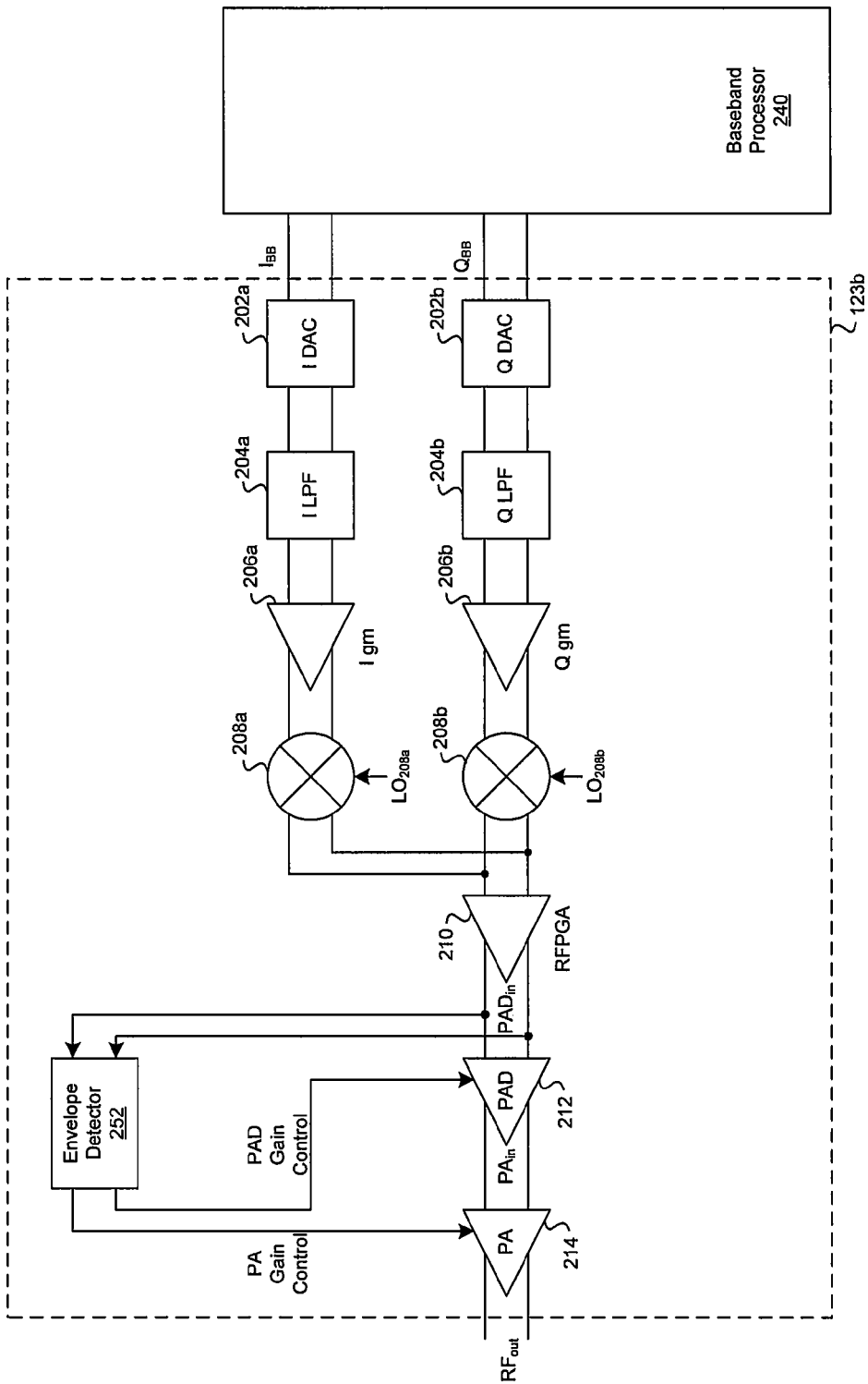
FIG. 2 is an exemplary block diagram illustrating an RF transmitter utilizing power amplifier driver gain variation, in accordance with an embodiment of the invention.

FIG. 2 is an exemplary block diagram illustrating an RF transmitter utilizing power amplifier driver gain variation, in accordance with an embodiment of the invention. Referring to FIG. 2, there is shown an RF transmitter 123b, an envelope detector 252, and a baseband processor 240. The RF transmitter 123b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I digital to analog converter (I DAC) 202a, and a Q DAC 202b.

The PA 214 may comprise suitable logic, circuitry, and/or code that may enable amplification of input signals to generate a transmitted signal of sufficient signal power (as measured by dBm, for example) for transmission via a wireless communication medium. In an exemplary embodiment of the invention, the PA 214 may receive a differential input signal, labeled $PA_{in}$ in FIG. 2, and output a differential output signal, labeled $RF_{out}$ in FIG. 2. In addition, the PA 214 may receive a control signal, labeled PA Gain Control in FIG. 2, which may enable the PA 214 to dynamically select a gain level, referred to as $g_3(t)$. The gain level may vary with time in response to the PA Gain Control signal. The gain level may determine an amplification level by which the input signal $PA_{in}$ may be amplified to generate the output signal $RF_{out}$.

The PAD 212 may comprise suitable logic, circuitry, and/or code that may enable amplification of input signals to generate an amplified output signal. The PAD 212 may be utilized in multistage amplifier systems wherein the output of the PAD 212 may be an input to a subsequent amplification stage. In an exemplary embodiment of the invention, the PAD 212 may receive a differential input signal, labeled as $PAD_{in}$ in FIG. 2, and output a differential output signal, labeled $PA_{in}$ in FIG. 2. In addition, the PAD 212 may receive a control signal, labeled PAD Gain Control in FIG. 2, which may enable the PAD 212 to dynamically select a gain level, referred to as $g_2(t)$. The gain level may vary in time in response to the PAD Gain Control signal. The gain level may determine an amplification level by which the input signal $PAD_{in}$ may be amplified to generate the output signal $RF_{out}$.

The RFPGA 210 may comprise suitable logic, circuitry, and/or code that may enable amplification of input signals to generate an amplified output signal, wherein the amount of amplification, as measured in dB for example, may be determined based on an input control signal. In various embodiments of the invention, the input control signal may comprise binary bits. In an exemplary embodiment of the invention, the RFPGA 210 may receive a differential input signal and generate a differential output signal, labeled as $PAD_{in}$ in FIG. 2.

The transmitter I mixer 208a may comprise suitable logic, circuitry, and/or code that may enable generation of an RF signal by upconversion of an input signal. The transmitter I mixer 208a may utilize an input local oscillator signal labeled as $LO_{208a}$ to upconvert the input signal. The upconverted signal may be an RF signal. The transmitter I mixer 208a may produce an RF signal for which the carrier frequency may be equal to the frequency of the signal $LO_{208a}$. In an exemplary embodiment of the invention, the transmitter I mixer 208a may receive a differential input signal and generate a differential output signal.

The transmitter Q mixer 208b may be substantially similar to the transmitter I mixer 208a. The transmitter Q mixer 208b may utilize an input local oscillator signal labeled as $LO_{208b}$ in quadrature (in FIG. 2) to upconvert the input signal.

The I gm 206a may comprise suitable, logic, circuitry, and/or code that may enable generation of an output current, the amplitude of which may be proportional to an amplitude of an input voltage, wherein the measure of proportionality may be determined based on the transconductance parameter, $gm_I$, associated with the I gm 206a. In an exemplary embodiment of the invention, the I gm 206a may receive a differential input signal and output a differential output signal.

The Q gm 206b may be substantially similar to the I gm 206a. The transconductance parameter associated with the Q gm 206b is $gm_Q$.

The I LPF 204a may comprise suitable logic, circuitry, and/or code that may enable selection of a cutoff frequency, wherein the LPF may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the I LPF 210a may be implemented as a passive filter, such as one that utilizes resistor, capacitor, and/or inductor elements, or implemented as an active filter, such as one that utilizes an operational amplifier. In an exemplary embodiment of the invention, the I LPF 210a may receive a differential input signal and output a differential output signal.

The Q LPF 204b may be substantially similar to the I LPF 204a.

The I DAC 202a may comprise suitable logic, circuitry, and/or code that may enable conversion of an input digital signal to a corresponding analog representation.

The Q DAC 202b may be substantially similar to the I DAC 202a.

The envelope detector 252 may comprise suitable logic, circuitry and/or code that may enable detection of an amplitude of a time varying input signal, labeled as $PAD_{in}$ in FIG. 2. Based on the detected amplitude of the input signal, the envelope detector 252 may enable generation of output signals, labeled as PA Gain Control and PAD Gain Control in FIG. 2.

The baseband processor 240 may comprise suitable logic, circuitry, and/or code that may enable processing tasks, which correspond to one or more layers in an applicable protocol reference model (PRM). For example, the baseband processor 240 may perform physical (PHY) layer processing, layer 1 (L1) processing, medium access control (MAC) layer processing, logical link control (LLC) layer processing, layer 2 (L2) processing, and/or higher layer protocol processing. The processing tasks performed by the baseband processor 240 may be referred to as being within the digital domain. The baseband processor 240 may also generate control signals. In an exemplary embodiment of the invention, the baseband processor 240 may generate differential output signals. The differential output signals may be referred to as quadrature baseband signals labeled $I_{BB}$ and $Q_{BB}$ in FIG. 2.

In operation, the baseband processor 240 may generate baseband signals $I_{BB}$ and $Q_{BB}$, comprising a sequence of bits to be transmitted via a wireless communications medium. The baseband processor 240 may send the $I_{BB}$ signal to the I DAC 202a, and send the $Q_{BB}$ signal to the Q DAC 202b. The I DAC 202a may generate an analog signal. The Q DAC 202b may similarly generate an analog signal.

The analog signals generated by the I DAC 202a and Q DAC 202b may comprise undesirable frequency components. The I LPF 204a and Q LPF 204b may attenuate signal amplitudes associated with these undesirable frequency components in signals generated by the I DAC 202a and Q DAC 202b respectively. The baseband processor 240 may configure the transmitter I mixer 208a to select a frequency for the $LO_{208a}$ signal utilized to upconvert the filtered signal from the I LPF 204a. The upconverted signal output from the transmitter I mixer 208a may comprise an I component RF signal. The baseband processor 240 may similarly configure the transmitter Q mixer 208b to generate a Q component RF signal from the filtered signal from the Q LPF 204b.

The RFPGA 210 may amplify the I component and Q component RF signals to generate an RF signal, wherein the level of amplification provided by the RFPGA 210 may be configured based on control signals generated by the baseband processor 240. The RFPGA 210 may generate a differential output signal, $PAD_{in}$. The envelope detector 252 may receive the $PAD_{in}$ signal and detect the time varying signal amplitude $\|PAD_{in}(t)\|$. The envelope detector 252 may generate control signals PA Gain Control and PAD Gain Control based on the detected signal amplitude. The PA Gain Control signal may enable the PA 214 to dynamically adjust the gain, $g_3(t)$, and the PAD Gain Control signal may enable the PAD 212 to dynamically adjust the gain, $g_2(t)$. The envelope detector 252 may enable dynamic adjustments for the gain $g_2(t)$ and the gain $g_3(t)$ such that:

$$c_1 = g_2(t) \cdot g_3(t) \qquad [2]$$

where $c_1$ is a numerical constant.

The PAD 212 may provide a second stage of amplification, $g_2(t)$, for the $PAD_{in}$ signal generated by the RFPGA 210. The PAD 212 may dynamically adjust the gain $g_2(t)$ in response to the PAD Gain Control signal from the envelope detector 252. The PAD 212 may generate an input signal to the PA 214, labeled $PA_{in}$ in FIG. 2.

The PA 214 may provide a third stage of amplification, $g_3(t)$, for the $PA_{in}$ signal generated by the PAD 212. The PA 214 may dynamically adjust the gain $g_3(t)$ in response to the PA Gain Control signal from the envelope detector 252. The PA 214 may generate an output signal, labeled $RF_{out}$ in FIG. 2. The amplified signal from the PA 214, $RF_{out}$, may be transmitted to the wireless communications medium via the antenna 121.

In an exemplary embodiment of the invention, an increase in the amplitude $\|PAD_{in}(t)\|$ may result in a decrease in the gain level $g_2(t)$ and a corresponding increase in the gain level $g_3(t)$ in accordance with equation [2]. The decrease in the gain level $g_2(t)$ may, for example, enable the amplitude $\|PA_{in}(t)\|$ to remain constant even when there is an increase in the amplitude $\|PAD_{in}(t)\|$. The increase in the gain level $g_3(t)$ may enable the overall gain level between the signal $PAD_{in}$ and the signal $RF_{out}$ to remain constant at a level $c_1$ (as set forth in equation [2] above) even when the respective intermediate gain levels $g_2(t)$ and $g_3(t)$ are dynamically adjusted. For example, when $\|PAD_{in}(t)\|$ decreases, the PAD gain $g_2(t)$ increases, and the PA gain $g_3(t)$ decreases such that $\|PA_{in}(t)\|$ remains constant. In various embodiments of the invention, the increase in $g_2(t)$ and decrease in $g_3(t)$ are in accordance with equation [2]. The value of $\|PA_{in}(t)\|$ may be selected to enable the PA 214 to operate with high efficiency. Thus, in various embodiments of the invention, the peak to average ratio at the PA may be reduced in comparison to systems, which do not dynamically adjust PA gain and/or PAD gain levels.

Figure 3:
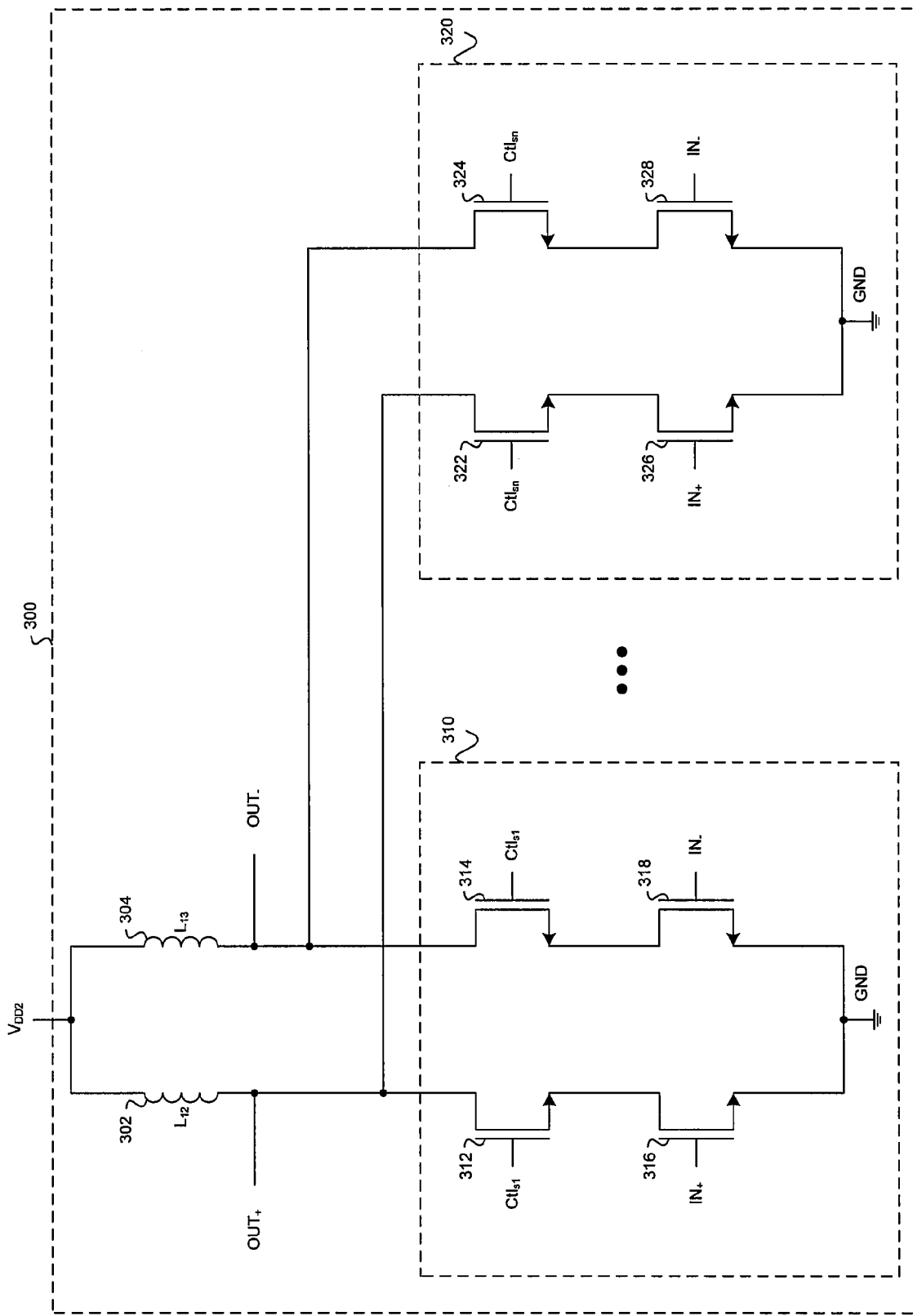
FIG. 3 is a diagram of an exemplary amplifier with programmable gain, in accordance with an embodiment of the invention.

FIG. 3 is a diagram of an exemplary amplifier with programmable gain, in accordance with an embodiment of the invention. Referring to FIG. 3, there is shown an amplifier 300. The amplifier 300 may comprise a plurality of inductors 302 and 304, and a plurality of gain stages 310, . . . , and 320. The gain stage 310 may comprise a plurality of transistors 312, 314, 316 and 318. The gain stage 320 may comprise a plurality of transistors 322, 324, 326 and 328.

The plurality of gain stages 310, . . . , and 320 may comprise individually selectable gain stages that may be enabled so as to dynamically increase gain, $g_A(t)$, for the amplifier 300, or disabled so as to dynamically decrease amplifier 300 gain $g_A(t)$. The gain $g_A(t)$ may be a measure of signal amplification between the amplifier 300 inputs, labeled $IN_+$ and $IN_-$ in FIG. 3, and the outputs, labeled $OUT_+$ and $OUT_-$. Individual gain stages may be selected based on gain control signal, such as the signals labeled PA Gain Control and PAD Gain Control in FIG. 2. The gain stage 310 may represent a first gain stage in the plurality of gain stages, and the gain stage 320 may represent a last gain stage in a plurality of n gain stages.

The gain stage 310 may receive a control signal, labeled $Ctl_{s1}$ in FIG. 3, which may be utilized to enable or disable the gain stage 310. When enabled, the gain stage 310 may provide a $g_{s1}$ level of amplification of the differential input signal to transistors 316 and 318, labeled as $IN_+$ and $IN_-$ respectively in FIG. 3. The first stage gain level, $g_{s1}$, may contribute to the overall level of gain in the amplifier 300, $g_A(t)$.

The gain stage 320 may receive a control signal, labeled $Ctl_{sn}$ in FIG. 3, which enables or disables the gain stage 320. When enabled, the gain stage 320 may provide a $g_{sn}$ level of amplification of the differential input signal to transistors 326 and 328, labeled as $IN_+$ and $IN_-$ respectively in FIG. 3. The $n^{th}$ stage gain level, $g_{sn}$, may contribute to the overall level of gain in the amplifier 300, $g_A(t)$.

The overall level of gain, $g_A(t)$, for the amplifier 300 may be collectively based on the individual stage gains, $g_{si}$, for each of the enabled gain stages i.

The amplifier 300 may be representative of the PA 214 and/or the PAD 212. When representing the PA 214, the input signals $IN_+$ and $IN_-$ may represent the signal labeled $PA_{in}$ in FIG. 2, the output signals $OUT_+$ and $OUT_-$ may represent the signal labeled $RF_{out}$, and the control signals for the gain stages $Ctl_{si}$ may represent the signal labeled PA Gain Control. When representing the PAD 212, the input signals $IN_+$ and $IN_-$ may represent the signal labeled $PAD_{in}$ in FIG. 2, the output signals $OUT_+$ and $OUT_-$ may represent the signal labeled $PA_{in}$, and the control signals for the gain stages $Ctl_{si}$ may represent the signal labeled PAD Gain Control.

Figure 4:
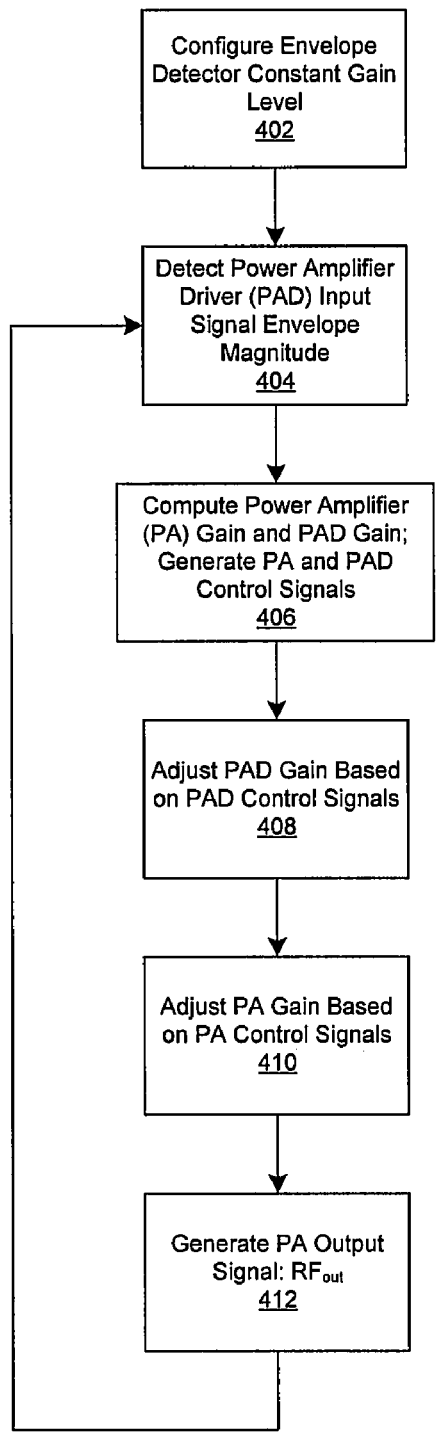
FIG. 4 is a flow chart illustrating exemplary steps for a method and system for enhancement of power amplifier efficiency through controlled variation of gain in a power amplifier driver, in accordance with an embodiment of the invention.

FIG. 4 is a flow chart illustrating exemplary steps for a method and system for enhancement of power amplifier efficiency through controlled variation of gain in a power amplifier driver, in accordance with an embodiment of the invention. Referring to FIG. 4, in step 402 the baseband processor 240 configure the envelope detector 252 for a constant gain level $c_1$, as shown in equation [2]. In step 404, the envelope detector 252 may detect the PAD input signal envelope magnitude $\|PAD_{in}(t)\|$. In step 406, the envelope detector 252 may dynamically compute the PA gain level $g_3(t)$ and the PAD gain level $g_2(t)$. The values $g_2(t)$ and $g_3(t)$ may be computed in accordance with equation [2]. The envelope detector 252 may generate PA Gain Control signals (FIG. 2) in response to the computed value $g_3(t)$, and PAD Gain Control signals in response to the computed value $g_2(t)$.

In step 408, the PAD 212 may receive PAD Gain Control signals that enable the PAD 212 to be configured to provide a gain level, $g_2(t)$, for amplification of the $PAD_{in}$ signal. In step 410, the PA 214 may receive PA Gain Control signals that enable the PA 214 to be configured to provide a gain level, $g_3(t)$, for amplification of the $PA_{in}$ signal. In step 412, the PA 214 may generate an output signal, $RF_{out}$. Step 404 may follow step 412 as the envelope detector 252 detects a subsequent input signal envelope magnitude.

FIG. 4 describes a method and system for dynamically adjusting the PAD gain level, $g_2(t)$, and/or the PA gain level, $g_3(t)$, during continuous operation such that the amplitude of the input signal to the PA 214, $\|PA_{in}(t)\|$, is maintained approximately constant. The amplitude of the input signal, $\|PA_{in}(t)\|$, may be selected to enable efficient operation of the PA 214 for a given level of delivered power from a DC power supply source, $P_{DC}$.

Aspects of a method and system for enhancement of power amplifier (PA) efficiency through controlled variation of gain in a power amplifier driver may comprise an envelope detector 252 that enables detection of an amplitude of an analog input signal. The envelope detector 252 may enable computation of a first gain value, $g_2(t)$, based on the detection. A second gain value, $g_3(t)$, may be computed based on the first gain value. A PA 214 may enable generation of an analog output signal based on the analog input signal, the first gain value and the second gain value. The multiplicative product of the first gain value and the second gain value may be a constant value. The amplitude of the analog input signal may be time varying.

A PAD 212 may enable generation of an intermediate analog signal based on the analog input signal and the first gain value. The PA 214 may enable generation of the analog output signal based on the intermediate analog signal and the second gain value. The amplitude of the intermediate analog signal may be constant. The envelope detector 252 may enable dynamic adjustment of the first gain value based on a detected change in the amplitude of the analog input signal at the PAD 212. The envelope detector 252 may enable dynamic adjustment of the second gain value in response to the dynamically adjusted first gain value. The multiplicative product of the first gain value and the second gain value may be approximately equal to the multiplicative product of the dynamically adjusted first gain value and the dynamically adjusted second gain value. The ratio of the detected amplitude of the analog input signal and an amplitude of the generated analog output signal may be a constant value.

In various embodiments of the invention, AM-AM distortion and/or AM-PM distortion that may result from dynamic gain adjustment may be reduced by utilizing a calibration feedback and input predistortion method as is described in U.S. patent application Ser. No. 11/618,876, which is incorporated herein by reference in its entirety.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling gain in an amplifier circuit, the method comprising:
   detecting an amplitude of an analog input signal;
   determining a gain value based in said detecting;
   determining at least one subsequent gain value based on said gain value;
   generating an intermediate analog signal based on said analog input signal and said gain value, wherein an amplitude of said intermediate analog signal is constant; and
   generating an analog output signal based on said analog input signal, said gain value and said at least one subsequent gain value.

2. The method according to claim 1, wherein a multiplicative product of said gain value and said at least one subsequent gain value is a constant value.

3. The method according to claim 1, comprising generating said analog output signal based on said intermediate analog signal and said at least one subsequent gain value.

4. The method according to claim 1, comprising dynamically adjusting said gain value based on a detected change in said amplitude of said analog input signal.

5. The method according to claim 4, comprising dynamically adjusting at least a portion of said at least one subsequent gain value in response to said dynamically adjusted gain value.

6. The method according to claim 5, wherein a multiplicative product of said gain value and said at least one subsequent gain value is approximately equal to a multiplicative product of said dynamically adjusted gain value, said dynamically adjusted at least a portion of said at least one gain value and a remainder of said at least one subsequent gain value.

7. The method according to claim 1, wherein a ratio of said detected amplitude of said analog input signal and an amplitude of said generated analog output signal is a constant value.

8. A system for controlling gain in an amplifier circuit, the system comprising:
   one or more circuits that are operable to detect an amplitude of an analog input signal;
   said one or more circuits are operable to determine a gain value based on said detecting;
   said one or more circuits are operable to determine at least one subsequent gain value based on said gain value;
   said one or more circuits are operable to generate an intermediate analog signal based on said analog input signal and said gain value, wherein an amplitude of said intermediate analog signal is constant; and
   said one or more circuits are operable to generate an analog output signal based on said analog input signal, said gain value and said at least one subsequent gain value.

9. The system according to claim 8, wherein a multiplicative product of said gain value and said at least one subsequent gain value is a constant value.

10. The system according to claim 8, wherein said one or more circuits are operable to generate said analog output signal based on said intermediate analog signal and said at least one subsequent gain value.

11. The system according to claim 8, wherein said one or more circuits are operable to dynamically adjust said gain value based on a detected change in said amplitude of said analog input signal.

12. The system according to claim 11, wherein said one or more circuits are operable to dynamically adjust at least a portion of said at least one subsequent gain value in response to said dynamically adjusted gain value.

13. The system according to claim 12, wherein a multiplicative product of said gain value and said at least one subsequent gain value is approximately equal to a multiplicative product of said dynamically adjusted gain value, said dynamically adjusted at least a portion of said at least one gain value and a remainder of said at least one subsequent gain value.

14. The system according to claim 8, wherein a ratio of said detected amplitude of said analog input signal and an amplitude of said generated analog output signal is a constant value.

15. The method according to claim 1, comprising generating a control signal based on said gain value.

16. The method according to claim 15, comprising configuring a plurality of gain stages based on said control signal.

17. The method according to claim 1, comprising generating a corresponding control signal for each of said at least one subsequent gain value.

18. The method according to claim 17, comprising configuring a corresponding subsequent plurality of gain stages based on each said corresponding control signal.

19. The system according to claim 8, wherein said one or more circuits are operable to generate a control signal based on said gain value.

20. The system according to claim 19, wherein said one or more circuits are operable to configure a plurality of gain stages based on said control signal.

21. The system according to claim 8, wherein said one or more circuits are operable to generate a corresponding control signal for each of said at least one subsequent gain value.

22. The system according to claim 21, wherein said one or more circuits are operable to configure a corresponding subsequent plurality of gain stages based on each said corresponding control signal.

* * * * *